United States Patent [19]
Marrah et al.

[11] Patent Number: 5,991,609
[45] Date of Patent: *Nov. 23, 1999

[54] LOW COST DIGITAL AUTOMATIC ALIGNMENT METHOD AND APPARATUS

[75] Inventors: Jeffrey Joseph Marrah; Thomas Joseph Kennelly; Michael John Easterwood; Linh Ngoc Pham; Ronald W Dale, all of Kokomo, Ind.

[73] Assignee: Delco Electronics Corporation, Kokomo, Ind.

[ * ] Notice: This patent issued on a continued prosecution application filed under 37 CFR 1.53(d), and is subject to the twenty year patent term provisions of 35 U.S.C. 154(a)(2).

[21] Appl. No.: 08/774,969

[22] Filed: Dec. 26, 1996

[51] Int. Cl.$^6$ .................................................. H04B 1/00
[52] U.S. Cl. ..................................... 455/182.2; 455/192.2
[58] Field of Search ............................ 455/77, 120, 123, 455/125, 161.1, 161.2, 183.1, 183.2, 182.1, 182.3, 192.1, 192.2, 192.3, 197.2, 199.1, 340, 182.2; 327/3, 12; 334/16, 26

[56] References Cited

U.S. PATENT DOCUMENTS

| | | | |
|---|---|---|---|
| 3,255,414 | 6/1966 | Kawalek et al. | 327/3 |
| 3,820,100 | 6/1974 | Ballinger et al. | 340/568 |
| 4,079,320 | 3/1978 | Mogi | 455/182.3 |
| 4,712,060 | 12/1987 | Bailey et al. | 327/3 |
| 4,789,996 | 12/1988 | Butcher | 375/376 |
| 5,077,783 | 12/1991 | Leppanen | 455/67.4 |
| 5,126,602 | 6/1992 | Lee et al. | 327/12 |
| 5,152,005 | 9/1992 | Bcickley | 455/182.1 |
| 5,201,063 | 4/1993 | Tam et al. | 455/67.4 |
| 5,301,358 | 4/1994 | Gaskill et al. | 455/193.2 |
| 5,335,362 | 8/1994 | Vaisanen et al. | 455/186.1 |
| 5,428,829 | 6/1995 | Osburn et al. | 455/193.2 |
| 5,491,715 | 2/1996 | Flaxi | 455/193.2 |
| 5,524,288 | 6/1996 | Monge Navarro | 455/180.4 |
| 5,550,878 | 8/1996 | Shigaki et al. | 375/375 |
| 5,592,125 | 1/1997 | Williams | 327/12 |
| 5,619,148 | 4/1997 | Guo | 327/12 |
| 5,619,171 | 4/1997 | Rijckaert et al. | 327/12 |
| 5,697,068 | 12/1997 | Salvi et al. | 455/67.1 |

*Primary Examiner*—Reinhard J. Eisenzopf
*Assistant Examiner*—Makoto Aoki
*Attorney, Agent, or Firm*—Jimmy L. Funke

[57] ABSTRACT

A technique for the automatic alignment and tuning of the front end of a vehicle radio. A tuning voltage is applied to a multiplying digital-to-analog converter before being applied to a front end tuning circuitry of the radio. A tuning voltage antenna number is applied to the tuning voltage at the converter to scale the tuning voltage, and adjust the center frequency tuning of the front end. During alignment, the tuning voltage antenna number is used to modulate the tuning voltage around a mean by reprogramming the tuning voltage antenna number a few values higher and lower in sequence. This modulation of the antenna tuning voltage creates an AC modulation component on the signal strength indicator signal passing through the front end. The signal strength indicator signal is measured and compared to its value before the tuning voltage antenna number was changed. If the signal strength indicator signal is higher for a higher tuning voltage antenna number, the front end is misaligned to the low side of the desired alignment point. Likewise, if the signal strength indicator signal is lower for an increasing tuning voltage antenna number, the front end is misaligned to the high side. If there is no change in the signal strength indicator signal for both increases and decreases in the tuning voltage antenna number, the front end is optimally aligned.

18 Claims, 4 Drawing Sheets

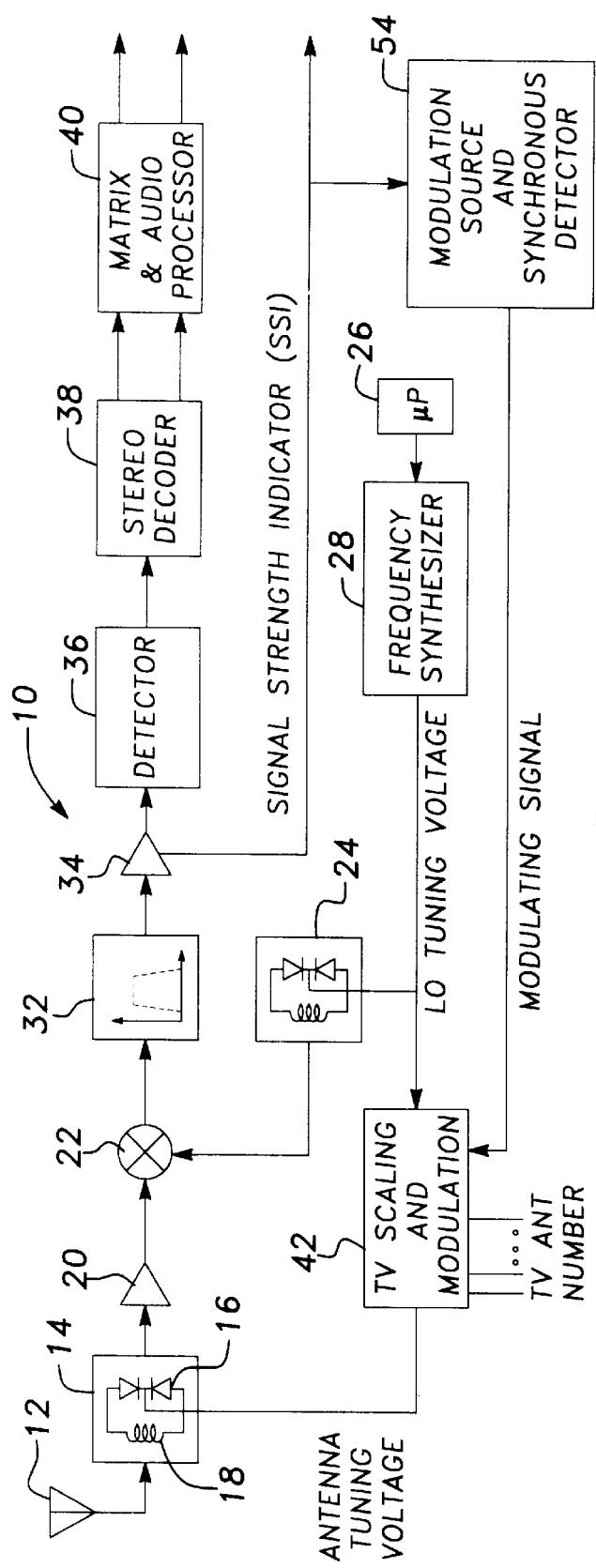
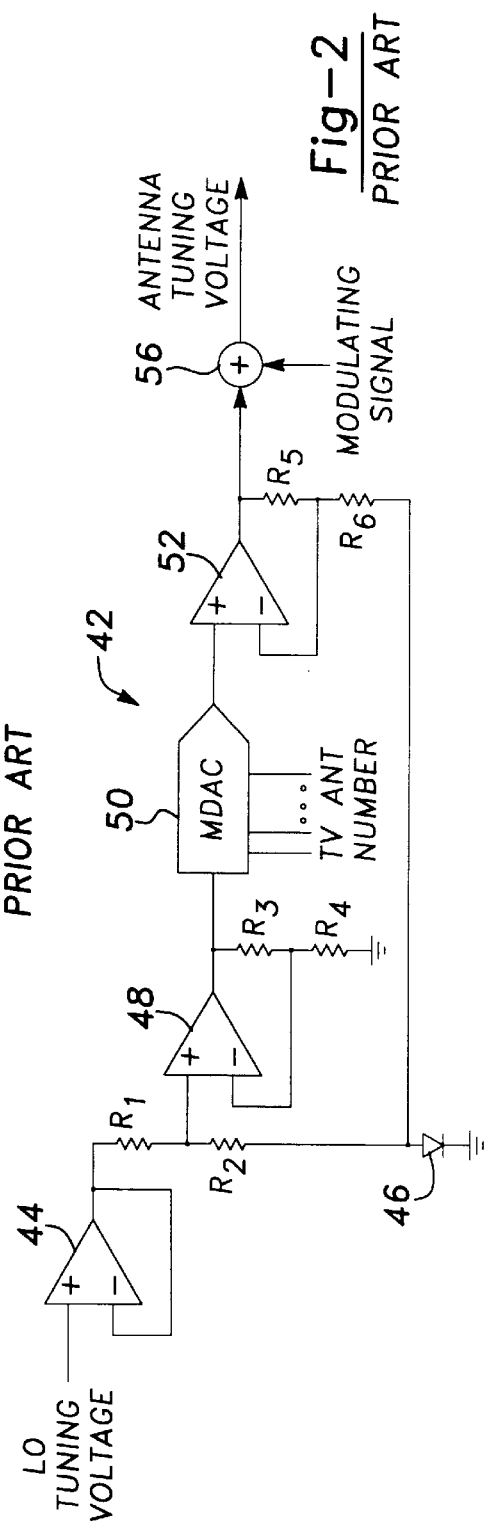
Fig-1 PRIOR ART
Fig-2 PRIOR ART

LOW COST DIGITAL AUTOMATIC ALIGNMENT METHOD AND APPARATUS

BACKGROUND OF THE INVENTION

1. Field of the Invention

This invention relates generally to a technique for performing automatic alignment and tuning of a radio receiver and, more particularly, to a technique using a software algorithm in connection with a test/alignment station on a production line of vehicle radios to digitally and automatically align and tune the various tuning circuits and components in the radios.

2. Discussion of the Related Art

As is well understood in the art, radio receivers are responsive to radio frequency (RF) signals broadcast from a transmission antenna to convert the signals into a desirable format, such as speech or music. An antenna associated with the receiver captures the electromagnetic energy of the RF signals from the surroundings, and converts this energy into electrical currents that are subsequently processed. Typically, a radio receiver will be separated into an amplitude modulation (AM) portion and a frequency modulation (FM) portion. In the United States, the AM portion is tunable to RF signals in the frequency band from 530 to 1710 kHz, and the FM portion is tunable to RF signals in the frequency band from 88 to 108 MHz.

In order to tune the received RF signals to a desired station for broadcast, the receiver will include a variety of tuned circuits. FIG. 1 shows a schematic block diagram of a known FM receiver section 10 of a radio receiver that is responsive to RF signals, and can be tuned in the FM radio frequency bandwidths. The FM receiver section 10 is intended to represent various types of electronically tuned, superheterodyne FM receivers known in the art, and is especially intended to represent such a receiver for use in a vehicle. Electromagnetic energy in the form of RF signals is received by a radio frequency antenna 12, and is applied to a tunable bandpass filter circuit, particularly a tunable tank circuit 14, that is tuned to establish a bandwidth having a particular center frequency. The tank circuit 14 will be tuned to a particular center frequency for a radio station, and its bandwidth will cover several adjacent stations. When the tank circuit 14 is tuned to a particular frequency in the FM frequency bandwidth, the RF signals received from the antenna 12 and applied to the tank circuit 14 at the tuned frequency are passed by the tank circuit 14, and frequencies outside of this bandwidth are rejected. The tank circuit 14 provides RF selectivity, and is tunable to about a 2 MHz bandwidth, and thus limits the bandwidth so that frequencies entering the FM receiving section 10 are not outside the FM spectrum. Typically there will be one to three of these types of RF selective filters to provide this function.

The tank circuit 14 includes a pair of back-to-back varactor diodes 16 and a coil 18 making up an LC circuit that establishes the resonant frequency of the circuit 14. Other capacitive components would also be included in the tank circuit 14 to establish the resonant frequency. A tuning voltage potential applied between the varactor diodes 16 acts to adjust the center frequency output of the tank circuit 14, and thus acts to tune the receiver section 10 to a particular FM center frequency usually the frequency of a station being tuned. The coil 18 would generally include a ferrite core that is selectively positionable within the coil 18 to set or tune the frequency of the tank circuit 14.

The output of the tank circuit 14 is the RF signal received by the antenna 12 that is bandpass filtered by the tank circuit 14. This selected RF signal is applied to a low noise RF amplifier 20 to be amplified. The amplifier 20 is a preamplifier that gives gain sensitivity and a higher signal-to-noise ratio. The amplified output from the amplifier 20 is then applied to a mixer 22 that mixes the selected and amplified RF signal with an RF signal from a local oscillator 24, also a tuned tank circuit, to establish an intermediate frequency, for example 10.7 MHz, that is suitable for subsequent processing by the components of the receiver section 10. The combination of the antenna 12, the tank circuit 14, the amplifier 20 and the mixer 22 is typically referred to as the "front end" of the receiver section 10. The input to the mixer 22 from the local oscillator 24 is selected so that no matter what frequency the tank circuit 14 is tuned to, the intermediate frequency will always be the same. By establishing a common intermediate frequency in this manner, inexpensive, highly repeatable components can be used in the receiver section 10 having suitable tolerances without the need for providing expensive, high tolerance components, as is well understood in the art.

The receiver section 10 is tuned to a particular FM station by controls on a front panel (not shown) of the radio. The controls on the front panel are connected as inputs to a microprocessor 26. The microprocessor 26 determines the desired FM channel frequency and sends a serial data string to a frequency synthesizer 28. The frequency synthesizer 28 includes a phase locked loop (PLL) (not shown) and other suitable components to generate a tuning voltage output, in a manner that is well understood in the art. The tuning voltage output of the frequency synthesizer 28 is used to apply a voltage to the varactor diode 16 in the tank circuit 14 and the varactor diode in the local oscillator 24 so as to adjust the tuning frequency of the circuits.

The intermediate frequency signal from the mixer 22 is applied to an intermediate frequency filter circuit 32. The filter circuit 32 provides the selectivity which isolates the desired station within the selected FM frequency spectrum from the tank circuit 14. The filtered intermediate frequency from the filter circuit 32 is applied to an intermediate frequency amplifier 34 to amplify the intermediate frequency for subsequent processing. The filter circuit 32 selects the desired FM station by employing narrow band filtering.

The amplifier 34 amplifies the intermediate frequency signal to a level high enough to drive an FM detector 36. The FM detector 36 extracts the transmitted information on the RF signal through a frequency-to-voltage conversion. The FM detector 36 can be any suitable detector for the purposes described herein, such as a quadrature circuit. The detected RF signal from the detector 36 is applied to a stereo decoder 38 that separates the signal into left−right and left −Êright channels. The separated signals from the stereo decoder 38 are applied to a matrix and audio processor 40 that converts the left+right and left−right signals into left and right audio signals. The left and right FM audio signals from the processor 40 are then applied to subsequent processing circuitry (not shown), and then to the system speakers (not shown).

The tank circuit 14 is tuned to the frequency of a desired station and the local oscillator 24 is tuned relative to the frequency of the desired station so that the output of the mixer 22 is set at the intermediate frequency, here 10.7 MHz. In operation, the mixer 22 passes the difference between the selected frequency from the tank circuit 14 and the tuned frequency of the local oscillator 24. However, the operation of the mixer 22 also passes the addition of the selected frequency from the tank circuit 14 and the tuned frequency of the local oscillator 24. In order to prevent this image frequency from being passed by the mixer 22, the range of the tank circuit 14 is limited to a somewhat narrow bandwidth. The selectivity of the tank circuit 14 is usually limited to be narrower than 20 MHz to provide significant attenuation more than 20 MHz away from the desired frequency. Thus, the primary purpose of the tuned tank circuit 14 is to provide selectivity in the front end of the receiver section 10 before the mixer 22 to attenuate the image frequency so that it doesn't pass through the filter circuit 32. Even though the tank circuit 14 is tuned to a particular station, there is a number of other stations, for example about five stations, along the FM bandwidth selected by the tuned tank circuit 14. However, the center frequency of the tank circuit 14 has to be tuned to the desired station as the receiver section 10 is tuned to different radio stations.

Because modern radios are electronically tuned, using the varactor diodes, a problem exists in that there is not perfect tracking between the adjustments of the center frequency of the tank circuit 14 and the local oscillator 24 from receiver to receiver. As discussed above, the RF selectivity of the tank circuit 14 is centered at the desired FM frequency, and the local oscillator 24 is tuned to the value of the intermediate frequency (10.7 MHz) above the center frequency of the tank circuit 14. Because the LC components in the tank circuit 14 and the local oscillator 24 are not identical, even if the same tuning voltage is given to both circuits, the same center frequency would not be achieved. The center frequencies of the tank circuit 14 and the local oscillator 24 would not change the same amount for both filters for the same change in tuning voltage, and therefore tuning sensitivity would be lost because the RF selectivity of the tank circuit 14 would be attenuating the desired signal as it would not be centered relative to the local oscillator center frequency. Stated another way, by plotting out the center frequency of the local oscillator 24 on the X axis and the center frequency of the tank circuit 14 on the Y axis, it would be desirable to see a 45_ line shifted up by 10.7 MHz, or shifted down the direction being tuned. Therefore, for each radio receiver, the center frequencies of the local oscillator 24 and the tank circuit 14 must be adjusted relative to each other to get proper tuning.

In the prior art, in order to properly adjust the cores of the inductors, a signal generator is connected to the receiver section 10 at the antenna 12. The receiver section 10 and the signal generator are programmed to give a frequency at a particular location in the FM frequency band. The inductors in the tank circuit 14 and the local oscillator 24 are then adjusted by mechanically moving their ferrite cores so that the magnitude of the intermediate frequency signal is maximized, as provided by an automatic gain control plot. By adjusting the position of the cores of the inductors in the tank circuits 14 and 24, the center frequencies of the antenna circuit 14 and the local oscillator 24 will equal the output frequency of the frequency synthesizer 28 minus the intermediate frequency. This frequency would be the desired FM station frequency.

The mechanical adjustment of the components in the filter circuits, as discussed above, is a relatively time consuming and labor intensive process. Therefore, new techniques have been developed in the art to provide computer assisted mechanical alignment. One of those improvements is an automatic alignment technique as disclosed in U.S. Pat. No. 5,428,829 issued Jun. 27, 1995, titled METHOD AND APPARATUS FOR TUNING AND ALIGNING AN FM RECEIVER, assigned to the assignee of this application, and herein incorporated by reference.

In the FM receiver section 10, there is a DC voltage, typically referred to as the signal strength indicator (SSI), that can be taken from the amplifier 34, or the circuit components, and is proportional to the signal strength of the RF signal received by the antenna 12, or applied to the antenna 12 by a generator during alignment. In order to get an indication of whether the center frequency of the tank circuit 14 is aligned to the desired tuning alignment point, the voltage of the SSI signal can be monitored. In order to accomplish this, a known RF signal is applied to the antenna 12 by a generator, and the DC value of the SSI signal is measured. By modulating the tuning voltage applied to the varactor 16, the center frequency of the tank circuit 14 will be modulated back and forth. This modulation gets propagated all the way through the receiver section 10, and shows up as a square wave on the SSI voltage signal. Thus, a square wave is superimposed on the SSI voltage signal and is either in-phase or out-of-phase with the original modulating signal. Therefore, by looking at the SSI voltage signal as the tuning voltage is modulated, it is possible to tell if the tank circuit 14 is tuned to the desired alignment point.

Referring back to FIG. 1, for the technique disclosed in U.S. Pat. No. 5,428,829, the local oscillator tuning voltage from the frequency synthesizer 28 is applied to a tuning voltage (TV) scaling and modulation circuit 42 prior to being applied to the varactor diode 16 of the tank circuit 14. The circuit 42 scales the local oscillator tuning voltage to get a derivative of the tuning voltage that is applied to the varactor diode 16 in the tank circuit 14. The scaling is provided by a digital word tuning voltage (TV) antenna number that is used to set the center frequency of the tank circuit 14 for different stations during the operation of the receiver 10.

FIG. 2 shows a schematic block diagram of the components of the TV scaling and modulation circuit 42. The tuning voltage from the frequency synthesizer 28 is applied to the plus terminal of an amplifier 44 that acts as a buffer. The output of the amplifier 44 is connected to resistors $R_1$ and $R_2$ which act as a voltage divider in series with a diode 46. The divided voltage between the resistors $R_1$ and $R_2$ is applied to a positive terminal of an amplifier 48 which applies gain to the output of the amplifier 44, and also acts as a buffer. The output of the amplifier 48 is applied to a multiplying digital-to-analog converter (MDAC) 50.

The MDAC 50 acts as a programmable voltage divider controlled by the microprocessor 26 which provides the TV antenna number represented as a digital word. What the MDAC 50 does is takes an analog input, and multiplies it by a digital word to scale the analog input. In other words, the analog input from the amplifier 48 is divided by the digital TV antenna number to provide a divided analog output from the MDAC 50. For example, if an 8-bit digital word representing a gain of 1 is applied as the TV antenna number, the analog voltage signal applied from the amplifier 48 passes straight through the MDAC 50. If an 8-bit digital word representing a gain of 0.5 is applied as a TV antenna number to the MDAC 50, then the analog output of the MDAC 50 would be one-half the analog input from the amplifier 48 at the input to the MDAC 50. The analog output of the MDAC 50 is applied to the non-inverting terminal of an amplifier 52. The amplifier 52 is DC referenced to the voltage drop across the diode 46.

A modulation source and synchronous detector 54 is provided that includes a synchronous detector to determine whether the square wave superimposed on the SSI voltage signal is in-phase or out-of-phase with the modulating signal, or whether there is a square wave at all. This information is applied to the microprocessor 26. The detector 54 also generates the modulating signal that is applied to a summing junction 56 within the TV scaling modulation circuit 42. In one embodiment, the rate of modulation signal is 1 kHz. The modulating signal modulates the antenna voltage from the amplifier 52.

FIGS. 3(A)–3(C) show three graphs with voltage on the vertical axis and frequency on the horizontal axis. Each of the graphs gives a desired alignment point of the alignment between the center frequency of the tank circuit 14 and the local oscillator 24. The solid graph line represents the frequency bandwidth of the tank circuit 14 as tuned with the current tuning voltage antenna number. The dotted graph line represents the center frequency bandwidth of the tank circuit 14 for a subsequent higher tuning voltage antenna number as established by the microprocessor 26. As shown in FIG. 3A, an increase in the tuning voltage antenna number causes the center frequency of the tank circuit 14 to move away from the desired alignment point, and thus causes the SSI voltage signal to decrease because the designed alignment point is on the positive slope portion of the bandwidth curve of the tank circuit 14. This is a misalignment to the high side of the desired alignment point. FIG. 3B shows the situation where an increase in the tuning voltage antenna number causes the center frequency of the tank circuit 14 to move closer to the desired alignment point, and thus provides an increase in the SSI voltage signal because the desired alignment point is on the negative slope portion of the bandwidth curve of the tank circuit 14. FIG. 3C is the case where the tank circuit 14 is basically tuned to the desired alignment point with the current TV antenna number, where an increase in the tuning voltage antenna number does not cause the SSI voltage signal to significantly change. This is because the alignment point is at the top, flat portion of the tuning curve.

When the receiver section 10 is tuned by an operator, the microprocessor 26 programs the frequency synthesizer 28 to the proper frequency in the conventional manner. For each channel frequency, the microprocessor 26 provides the TV antenna number applied to the MDAC 50. This generates the proper tuning voltage to set the center frequency of the tank circuit 14 to the correct channel. To align the tank circuit 14, generally three alignment points are determined, as discussed above, and the microprocessor 26 interpolates between the alignment point to tune the receiver section 10 to intermediate channels.

The above described tuning procedure as disclosed in U.S. Pat. No. 5,428,829 requires the circuitry as described to generate a modulating signal, a tuning voltage modulator, and a synchronous detector to detect when the SSI voltage is "ain" or "out" of phase with the tuning voltage modulating signal. This circuitry is used once initially to tune the tank circuit 14 during production of the radio, and is not used again after the radio is tuned. Therefore, improvements can be made for tuning an electronically tunable radio that eliminates these circuits, and their associated cost. It is therefore an object of the present invention to provide an automatic alignment and tuning technique for a radio that includes these advantages.

SUMMARY OF THE INVENTION

In accordance with the teachings of the present invention, a low cost technique is disclosed for digital automatic alignment and tuning of a radio. A tuning voltage is applied to a multiplying digital-to-analog converter before being applied to front end tuning circuitry of the radio. A tuning voltage antenna number is applied to the tuning voltage at the converter to scale the tuning voltage, and adjust the center frequency tuning of the front end. During alignment, the tuning voltage antenna number is used to vary the tuning voltage around a mean by reprogramming the tuning voltage antenna number a few values higher and lower in sequence. This modulation of the antenna tuning voltage creates an AC modulation component on the signal strength indicator signal. The signal strength indicator signal is measured and compared to its value before the tuning voltage antenna number was changed. If the signal strength indicator signal is higher for a higher tuning voltage antenna number, the front end is misaligned to the low side of the desired alignment point. Likewise, if the signal strength indicator signal is lower for an increasing tuning voltage antenna number, the front end is misaligned to the high side of the desired alignment point. If there is no change in the signal strength indicator signal for both increases and decreases in the tuning voltage antenna number, the front end is optimally aligned.

In a specific application of the invention, a tester circuit is provided at the manufacturing level of the radio that applies a trigger signal to be compared with the signal strength indicator signal as the tuning voltage antenna number modulates the tuning voltage. The tester circuit determines whether the trigger signal is in-phase or out-of-phase with the signal strength indicator signal, and whether an AC signal is present on the signal strength indicator signal. These values are used to determine changes in the signal strength indicator signal.

Additional objects, advantages and features of the present invention will become apparent from the following description in appended claims, taken in conjunction with the accompanying drawings.

BRIEF DESCRIPTION OF THE DRAWINGS

FIG. 1 is a prior art schematic block diagram showing a known radio receiver including hardware and circuitry for automatic alignment and tuning of the radio;

FIG. 2 is a schematic block diagram of a TV scaling and modulation circuitry of the receiver section of FIG. 1.

DETAILED DESCRIPTION OF THE PREFERRED EMBODIMENTS

Figure 3A:
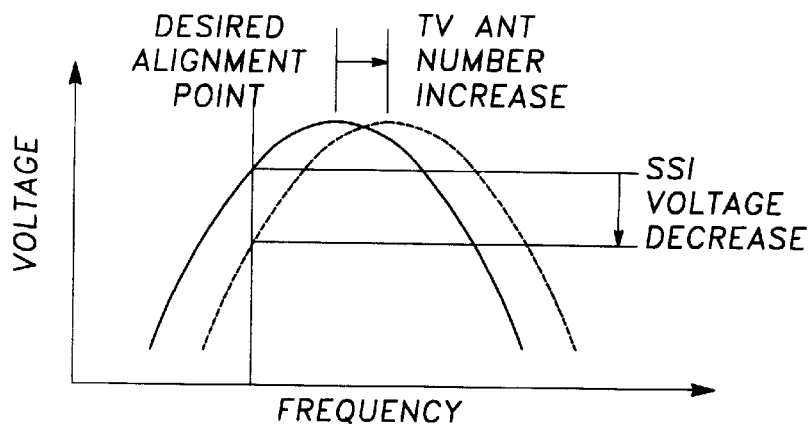
FIGS. 3a–3c are graphs of voltage on the vertical axis and frequency of the horizontal axis showing alignment and tuning of a radio.

The following discussion of preferred embodiments directed to an automatic digital tuning and alignment technique for an FM radio is merely exemplary in nature and is in no way intended to limit the invention or its applications or uses.

A description of how the SSI voltage signal is monitored to align and tune the FM front end of a FM radio receiver is discussed above and in U.S. Pat. No. 5,428,829. The present invention proposes using the TV antenna number and associated software to modulate the antenna tuning voltage, so as to eliminate certain circuitry previously necessary to align the radio receiver 10. Since the tuning voltage passes through the MDAC 50 before being applied to the varactor diode 16 in the FM front end circuitry, it is possible to vary the tuning voltage around its mean by simply reprogramming the TV antenna number a few values higher and lower in sequence. After each change in the TV antenna number, the SSI voltage signal changes. According to the technique of the present invention, this change in voltage is used to measure the phase of the SSI voltage signal relative to the direction of change in the TV antenna number. If the SSI voltage signal is higher for a higher TV antenna number, then the SSI voltage signal is in-phase, indicating the tank circuit 14 is misaligned to the low side. Likewise, if the SSI voltage signal is lower for increasing TV antenna numbers, then the SSI voltage signal is out-of-phase, indicating the tank circuit 14 is misaligned to the high side. If there is no SSI voltage signal change for both increases and decreases in the TV antenna number, the radio receiver is optimally aligned. This proposed technique would completely eliminate all of the circuitry associated with the modulation source and synchronous detector 54 and the summing junction 56 from the receiver 10 shown in FIGS. 1 and 2.

Figure 4:
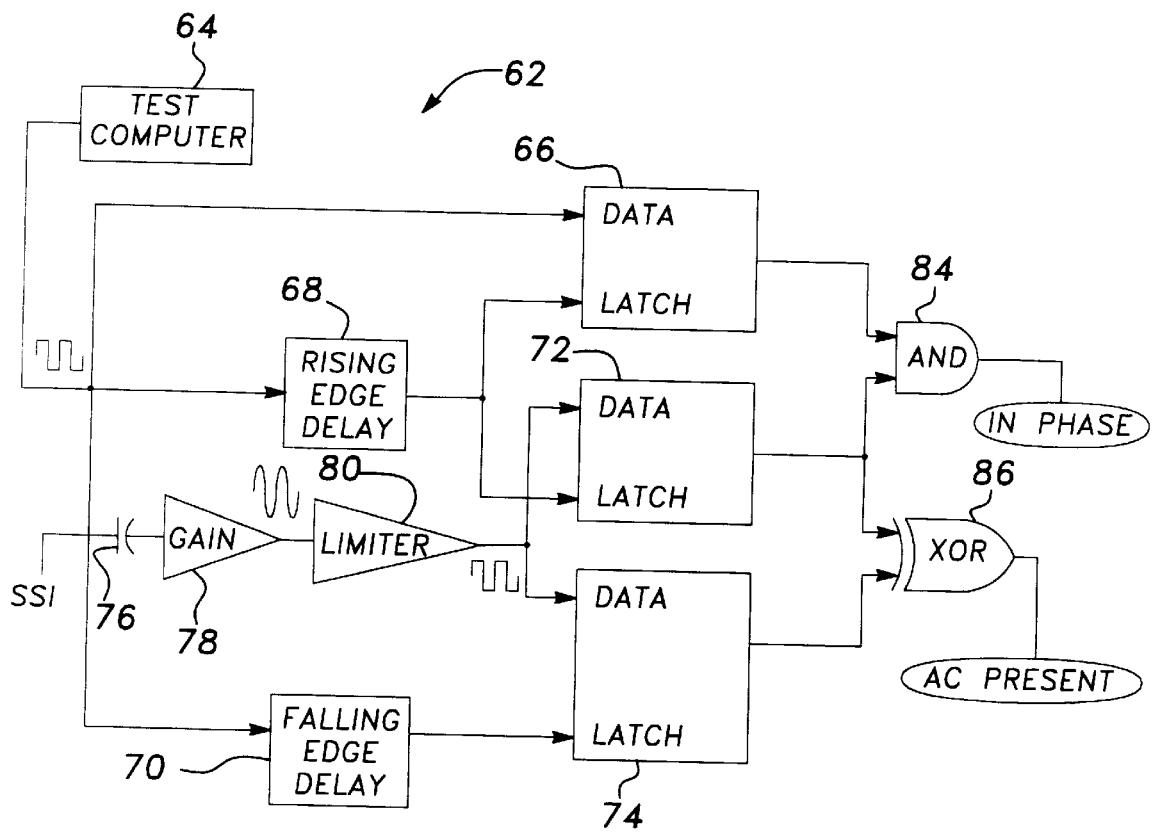
FIG. 4 is a block diagram of testing hardware to show signal flow in the alignment and tuning technique of the invention.

To perform the technique of the invention as described above, a custom tester circuit 62 is provided, according to one embodiment of the present invention, as shown in FIG. 4. The tester circuit 62 would be located at a position suitable for providing alignment during the production of the radios, and thus would not need to be incorporated in each of the radios individually. The purpose of the tester circuit 62 is to easily and effectively determine two conditions of the radio receiver. First, whether there is AC information present on the SSI voltage signal as a result of modulating the TV antenna number. Second, if there is AC information present on the SSI voltage signal, whether the AC information is "in" phase or "out" of phase with the modulation of the antenna tuning voltage. This is an indication of the receiver being misaligned to the low and high side, respectively, therefore telling the tester circuit 62 which way to adjust the center frequency of the tank circuit 14.

The tester circuit 62 includes a test computer 64 that stores and runs the alignment algorithm. The algorithm instructs the test computer 64 to generate a square wave trigger signal that is synchronous with the modulation of the TV antenna number, and thus in sequence with the modulation of the antenna tuning voltage. The square wave trigger signal is applied to each of the data input of a first digital latch 66, a rising edge detector circuit 68 that detects the rising edge of the square wave trigger signal, and a falling edge detector circuit 70 that detects the falling edge of the square wave trigger signal. An output of the rising edge detector circuit 68 goes high after a one-quarter cycle delay from the rising edge of the trigger signal, and this high output signal is applied to the latch input of the digital latch 66 and the latch input of a second digital latch 72. Additionally, the output of the falling edge detection circuit 70 goes high after a one-quarter cycle delay from the falling edge of the square wave trigger signal, and this high output signal is applied to the latch input of a third digital latch 74.

The SSI voltage signal is also applied to the tester circuit 62 as a DC voltage signal and may include an AC ripple component superimposed on the DC signal depending on how the tank circuit 14 is aligned to the desired alignment point. The SSI voltage signal is AC coupled to the circuit 62 by an AC filter capacitor 76 to filter off the DC component. The AC component, if it is present, is then amplified by a gain amplifier 78, and is limited by a limiter 80 to produce a suitable square wave signal for the circuit 62. The square wave or limited SSI signal is applied to the data inputs of both the latches 72 and 74. The outputs of the latch 66 and the latch 72 are applied to the inputs of an AND logic gate 84, and the outputs of the latch 72 and the latch 74 are applied to the inputs of an exclusive—OR (XOR) logic gate 86. The output of the latch 66 is latched high after a one-quarter cycle delay of the rising edge of the trigger signal. The output of the latch 72 is latched high after a one-quarter cycle delay of the rising edge of the trigger signal if the limited SSI voltage signal includes the AC component, and is in-phase with the trigger signal. Further, an output of the latch 74 is latched high after a one-quarter cycle delay from the falling edge of the trigger signal if the limited SSI signal includes the AC component, and is out-of-phase with the trigger signal. An output of the AND gate 84 will be high if both the outputs of the latches 66 and 72 are high. An output of the XOR gate 86 will be high if one of the inputs is high when the other input is low. The output of the AND gate 84 then gives an indication of whether the SSI voltage signal is in-phase or out-of-phase with the trigger signal, and the output of the XOR gate 86 gives an indication of whether the AC component is present on the SSI voltage signal.

Figure 3B:
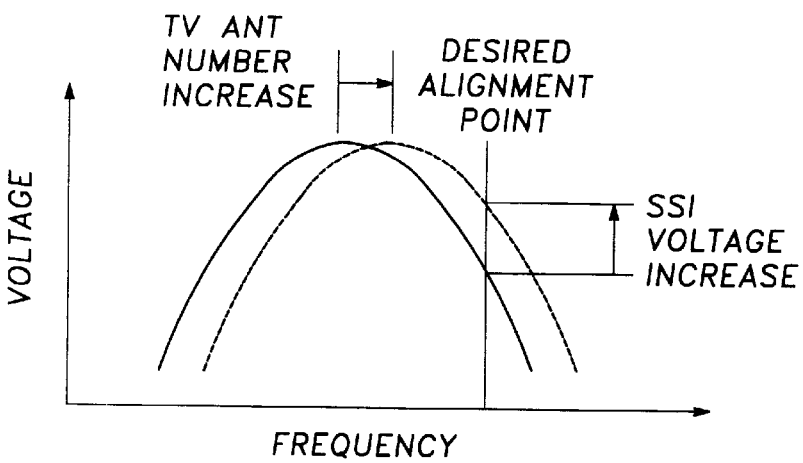
Figure 3C:
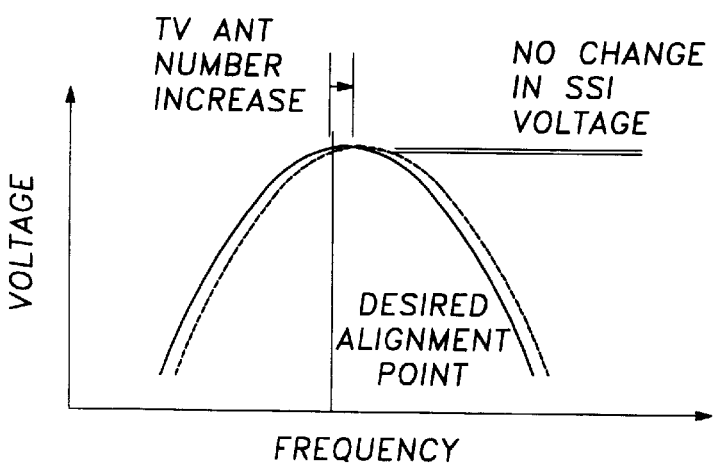
Figure 5:
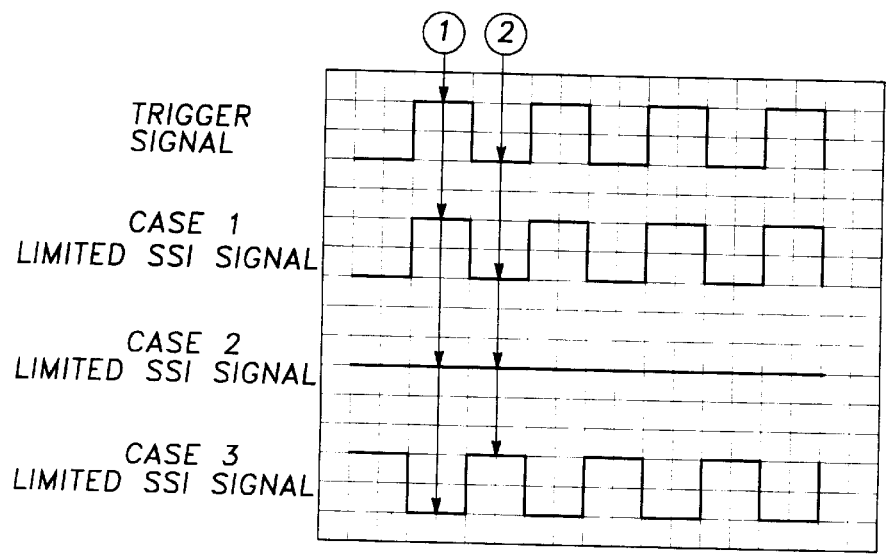
FIG. 5 is a series of timing diagrams showing signal flow through the hardware of FIG. 4.

FIG. 5 shows timing diagrams for the trigger signal and for the three possible cases of the relation between the limited SSI voltage signal and the trigger signal based on the alignment of the tank circuit 14. In case 1, the AC component on the limited SSI voltage signal is present and in-phase with the trigger signal, and indicates that the tank circuit 14 is misaligned to the low side of the desired alignment point, as indicated in FIG. 3B. Case 2 shows that the AC component is not present on the limited SSI voltage signal, and indicates that the tank circuit 14 is correctly aligned with the desired alignment point shown, as in FIG. 3C. Case 2 can also occur if there is a malfunction in the tester hardware or the radio receiver 10. And, case 3 indicates that the AC component is present on the limited SSI voltage signal and is out-of-phase with the trigger signal, indicating that the tank circuit 14 is misaligned to the high side of the desired alignment point, as in FIG. 3A. Additionally, two vertical lines are shown, and labelled state 1 and state 2. State 1 is the output of the latch 72 when the limited SSI signal is latched to the rising edge of the trigger signal, and state 2 is the output of the latch 74 when the limited SSI signal is latched to the falling edge of the trigger signal.

The digital latch 66 is used to maintain the trigger signal high after the rising edge of the trigger signal. If the outputs of both of the latches 66 and 72 are high, then the output of the AND gate 84 will also be high, indicating that the AC component on the limited SSI voltage signal is in-phase with the trigger signal. This is case 1, thus instructing the tester circuit 62 that the tank circuit 14 is misaligned to the low side of the desired alignment point. If the output of the latch 72 is not high, then the limited SSI signal is not in-phase with the trigger signal, and the output of the AND gate 84 will be zero, indicating that either case 2 or case 3 is present. Therefore, it is necessary to ascertain additional information to determine the situation. The XOR gate 86 provides AC present information by XORing the outputs of the digital latches 72 and 74. As mentioned above, the output of the digital latch 72 is the limited SSI signal at state 1, and the output of the latch 74 is the limited SSI signal at state 2. If the two signals are the same, the output of the XOR gate 86 will be low, indicting that no AC is present, or case 2. If these two signals are different, the output of the XOR gate 86 will be high, indicating that AC is present, and thus the limited SSI signal must be out-of-phase with the trigger signal, or case 3. Therefore, by monitoring the outputs of the logic gates 84 and 86, it is possible to tell if the tank circuit 14 is aligned, and if it is not aligned, how the antenna tuning voltage needs to be changed to cause the circuit 14 to be aligned.

A truth table is provided below showing all of the states, where output 1 is the output of the latch 66, output 2 is the output of the latch 72, and output 3 is the output of the latch 74.

TRUTH TABLE

| OUT 1 | OUT 2 | OUT 3 | CONDITIONS |
|---|---|---|---|
| Low | Low | Low | Error, OUT 1 must be High |
| Low | Low | High | Error, OUT 1 must be High |
| Low | High | Low | Error, OUT 1 must be High |
| Low | High | High | Error, OUT 1 must be High |
| High | Low | Low | Out-of-phase, No AC Present |
| High | Low | High | Out-of-phase, AC Present |
| High | High | Low | In-phase, AC Present |
| High | High | High | In-phase, No AC |

Figure 6:
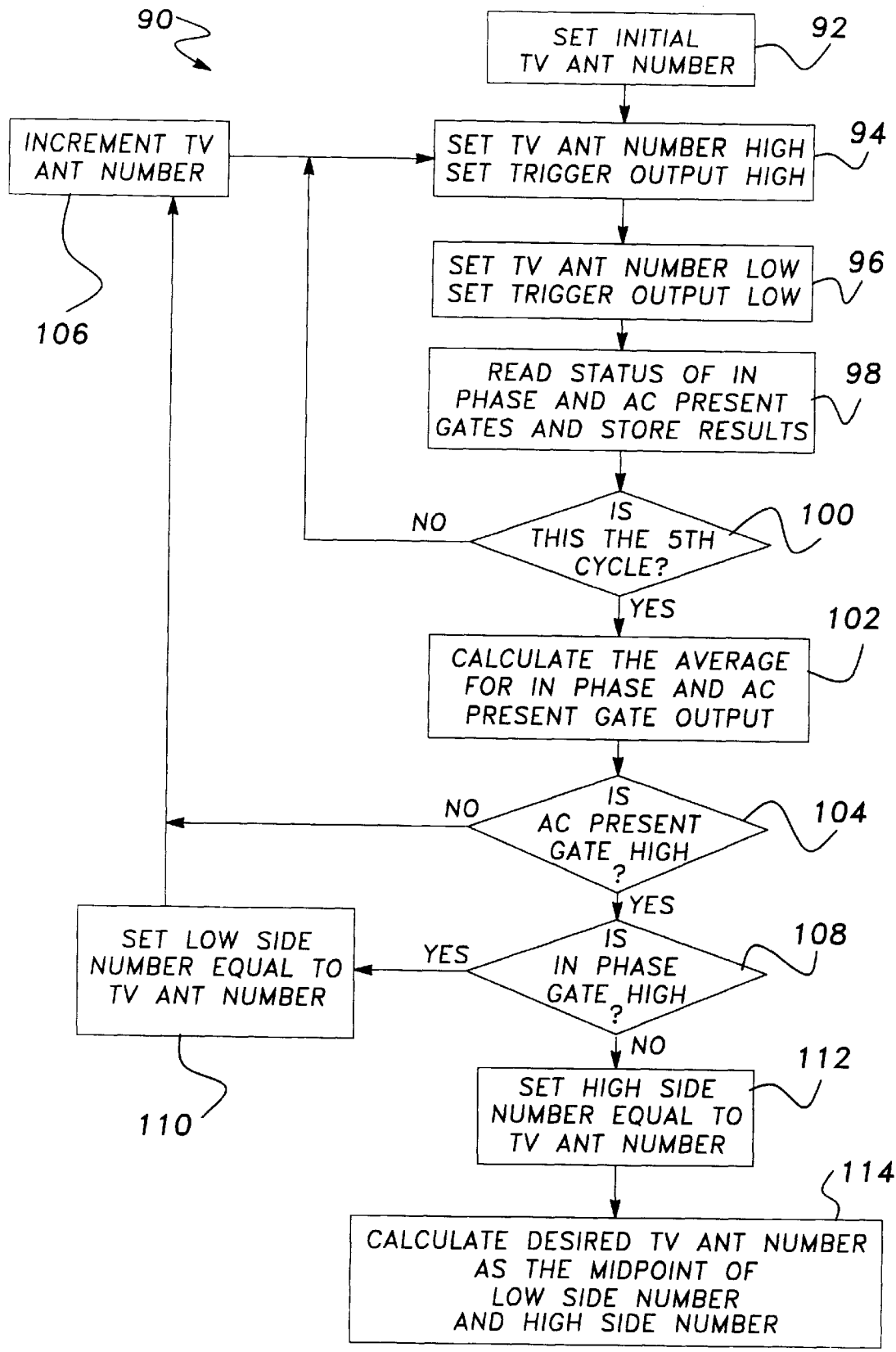
FIG. 6 is a flow chart diagram showing the operation of a tuning and alignment technique of the invention.

FIG. 6 shows a flow chart diagram 90 of the operation of the algorithm, in one embodiment, that the test computer 64 uses to operate the tester circuit 62, as discussed above, to determine whether the tank circuit 14 is aligned properly. The test computer 64 initiates the algorithm by first setting an initial TV antenna number to a value that will be close to the desired alignment point for the tank circuit 14 based on previous experiences, as indicated by box 92, but will cause the tank circuit 14 to be misaligned to the low side. To perform the modulation of the antenna tuning voltage, the TV antenna number is adjusted to some value higher than this initial value, for example 5 points higher, and the trigger signal is set high, as indicated by box 94. Next, the TV antenna number is adjusted to the same value lower than the initial value, and the trigger output is toggled low, as indicated by box 96. This provides one period of the trigger signal for states 1 and 2, as indicated in the signal flow diagram of FIG. 5.

After this cycle, the test computer 64 reads and stores the outputs of the AND gate 84 and the XOR gate 86, as indicated by box 98. Thus, the algorithm will know how the tank circuit 14 is tuned relative to the desired alignment point, as discussed above. The algorithm performs the steps of boxes 94, 96 and 98 a number of times to allow for settling of the hardware and to establish a steady state condition. Five times is chosen as a minimum number in that a larger number of times could be equally applicable. A decision diamond 100 determines whether a counter has reached five times indicating that the current outputs of the AND gate 84 and the XOR gate 86 should be accurate. The algorithm then calculates the average of all the previously stored values of the in-phase and AC present signals from the gates 84 and 86, respectively, as indicated by box 102. If three of the five iterations provides a certain value for each of the outputs of the AND gate 84 and the XOR gate 86, these values are determined as the true values for these gates.

Once the algorithm has calculated and stored the average AC present and the in-phase signals, the algorithm then determines whether the AC present gate 86 has been determined to be high, as indicated by diamond 104. If AC is not present, then the algorithm increments the TV antenna number in box 106. Since AC was not present, no determination of phase relationship is possible. If AC is present, then the phase relationship is checked in diamond 108, and if in-phase sets the variable "low-side number" to the current TV number in box 110 and increments the TV antenna number in box 106. The algorithm then returns to modulating the TV antenna number in accordance with boxes 94, 96 and 98 to determine whether the new frequency of the tank circuit 14 is tuned to the desired alignment point. In one embodiment, the amount of modulation of the TV antenna number is +/− 5 counts around the current value, although other values are applicable. This process continues until the outcome of the diamond 108 shows that the limited SSI signal is out-of-phase with the trigger signal. Then in box 112, the variable "high-side number" is set equal to the current value of TV antenna number. The algorithm then checks that the "low-side number" and "high-side number" have been set, indicating that the tank circuit 14 has passed through the alignment point. It then calculates the midpoint of these numbers as the optimal alignment point in box 114. This is done this way because phase measurements can not be made due to a lack of AC on the SSI signal (case 2 of FIG. 5). The embodiment shows that there are several values of TV antenna number near the desired alignment point that produce case 2. So the desired TV antenna number is the midpoint of this set of numbers. This midpoint value is stored in the radio receiver 10 so that the microprocessor 26 can output the appropriate antenna tuning voltage to the tank circuit 14 so that the tank circuit 14 is tuned with the local oscillator 24 to provide the desired circuit alignment. In this manner, the receiver 10 is aligned at the manufacturing level of the vehicle in accordance with the technique of automatic alignment discussed above, without the need for the circuitry of the modulation source and synchronous detector 54 of the prior art.

It is stressed that the particular algorithm discussed above in connection with the flow chart diagram 90 of FIG. 6 is by way of a non-limiting example. Other algorithms may be equally applicable in accordance with the teachings of the present invention to determine the alignment of the tank circuit 14 by modulating the antenna tuning voltage using the TV antenna number.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method of aligning and tuning a receiver front end of a radio receiver using a tester circuit that is a separate unit from the radio receiver and is electrically connected to the radio receiver during the aligning and tuning process, said method comprising the steps of:

generating a tuning voltage;

generating a tuning voltage antenna number;

combining the tuning voltage antenna number with the tuning voltage to modulate the tuning voltage with the tuning voltage antenna number;

changing the tuning voltage antenna number in order to vary the modulation of the tuning voltage;

applying the modulated tuning voltage to a tunable circuit in the receiver front end to modulate a tuned center frequency of the tunable circuit;

providing a signal strength indicator signal as the modulated tuning voltage modulates the tunable circuit, said signal strength indicator signal being an indicator of the strength of a signal applied to the receiver front end after the signal has passed through the front end;

providing the tester circuit as a separate unit from the radio receiver and electrically connecting the tester circuit to the radio receiver, said tester circuit receiving the signal strength indicator signal from the radio receiver;

generating a trigger signal in the tester circuit that is synchronous with the changes to the tuning voltage antenna number and in sequence with the modulation of the tuning voltage; and using digital logic circuitry in the tester circuit to determine whether the tunable circuit is aligned to a desirable alignment point based on changes to the signal strength indicator signal caused by the variations of the modulation of the tuning voltage, said digital logic circuitry determining whether the tunable circuit is aligned by comparing the trigger signal to the signal strength indicator signal, said digital logic circuitry determining whether the tunable circuit is aligned by determining whether an AC signal is superimposed on the signal strength indicator signal and then determining whether the tunable circuit is aligned to the desirable alignment point if no AC signal is superimposed on the signal strength indicator signal and the trigger signal is out-of-phase with the signal strength indicator signal.

2. The method according to claim 1 wherein the step of determining whether the tunable circuit is aligned includes determining whether the trigger signal is in-phase or out-of-phase with the signal strength indicator signal.

3. The method according to claim 2 wherein the step of determining whether the tunable circuit is aligned to the desirable alignment point includes determining that the tunable circuit is misaligned to a low side of a bandwidth curve of the tunable circuit if the trigger signal is in-phase with the signal strength indicator signal.

4. The method according to claim 1 wherein the step of determining whether the tunable circuit is aligned to the desirable alignment point includes determining that the tunable circuit is misaligned to a high side of a bandwidth curve of the tunable circuit if the trigger signal is out-of-phase with the signal strength indicator signal and an AC signal is superimposed on the signal strength indicator signal.

5. The method according to claim 1 wherein the step of determining whether the tunable circuit is aligned includes comparing a current signal strength indicator signal after the tuning voltage has been modulated by a first tuning voltage antenna number to a subsequent signal strength indicator signal after the tuning voltage has been modulated by a second tuning voltage antenna number.

6. The method according to claim 1 wherein the step of combining the tuning voltage antenna number with tuning voltage includes applying the tuning voltage to a multiplying digital-to-analog converter as an analog signal and applying the tuning voltage antenna number to the multiplying digital-to-analog converter as a digital signal.

7. The method according to claim 1 wherein the step of applying the modulated tuning voltage to a tunable circuit includes applying the modulated tuning voltage to a varactor diode of a tank circuit.

8. The method according to claim 1 wherein generating a tuning voltage, generating a tuning voltage antenna number, combining the tuning voltage antenna number with the tuning voltage to modulate the tuning voltage, changing the tuning voltage antenna number, applying the modulated tuning voltage to a tunable circuit and providing a signal strength indicator signal are all performed within the radio receiver.

9. A method of aligning and tuning a tunable circuit in a front end of a radio receiver to an intermediate frequency local oscillator in the radio receiver, said method including using a tester circuit that is a separate unit from the receiver and is electrically connected to the radio receiver during the alignment and tuning of the tunable circuit, said method comprising the steps of:

generating a tuning voltage to be applied to the tunable circuit;

applying the tuning voltage to a multiplying digital-to-analog converter;

generating a digital tuning voltage antenna number;

applying the tuning voltage antenna number to the multiplying digital-to-analog converter;

varying the tuning voltage antenna number so as to modulate the tuning voltage to create a modulated tuning voltage that is applied to the tunable circuit;

applying the modulated tuning voltage to the tunable circuit to modulate the center frequency of the tunable circuit;

providing the tester circuit as a separate unit from the radio receiver and electrically connecting the tester circuit to the radio receiver;

monitoring a signal strength indicator signal as the modulated tuning voltage modulates the tunable circuit in the tester circuit, said tester circuit receiving the signal strength indicator signal from the radio receiver, said signal strength indicator signal being an indicator of the strength of a signal applied to the receiver front end after the signal has passed through the front end, said step of monitoring the signal strength indicator signal including comparing a current signal strength indicator signal after the tuning voltage has been modulated by a first tuning voltage antenna number applied to the multiplying digital-to-analog converter to a subsequent signal strength indicator signal after the tuning voltage has been modulated by a second tuning voltage antenna number applied to the multiplying digital-to-analog converter;

generating a trigger signal in the tester circuit that is synchronous with the changes to the tuning voltage antenna number and in sequence with the modulation of the tuning voltage; and using digital logic circuitry in the tester circuit to determine whether the tunable circuit is aligned to the local oscillator at a desired alignment point based on changes between the current signal strength indicator signal and the subsequent signal strength indicator signal, said digital logic circuitry determining whether the tunable circuit is aligned by comparing the trigger signal to the signal strength indicator signal, said digital logic circuitry determining whether the tunable circuit is aligned by determining whether the trigger signal is in-phase or out-of-phase with the signal strength indicator signal, determining whether an AC signal is superimposed on the signal strength indicator signal, determining that the tunable circuit is misaligned to a low side of a bandwidth curve of the tunable circuit if the trigger signal is in-phase with the signal strength indicator signal, determining that the tunable circuit is aligned to the desirable alignment point if no AC signal is superimposed on the signal strength indicator signal and the trigger signal is out-of-phase with the signal strength indicator signal, and determining that the tunable circuit is misaligned to a high side of the bandwidth curve of the tunable circuit if the trigger signal is out-of-phase with the signal strength indicator signal and an AC signal is superimposed on the signal strength indicator signal.

10. The method according to claim 9 wherein the step of determining whether the tunable circuit is aligned includes determining whether the trigger signal is in-phase or out-of-phase with the signal strength indicator signal, and determining whether an AC signal is superimposed on the signal strength indicator signal.

11. The method according to claim 9 wherein the step of applying the modulated tuning voltage to the tunable circuit includes applying the modulated tuning voltage to a varactor diode of a tank circuit.

12. The method according to claim 9 wherein generating a tuning voltage, applying the tuning voltage to a multiplying digital-to-analog converter, generating a digital tuning voltage antenna number, applying the tuning voltage antenna number to the multiplying digital-to-analog converter, varying the tuning voltage antenna number and applying the modulated tuning voltage to the tunable circuit are all performed within the radio receiver.

13. A tester circuit for determining whether a tunable circuit in a front end of a radio receiver is tuned and aligned, said tester circuit being a separate unit from the radio receiver and being electrically connected to the radio receiver, said tester circuit being responsive to a signal strength indicator signal received from the radio receiver, said signal strength indicator signal being a signal that indicates the strength of a signal applied to the front end after it has passed through the front end, said tester circuit comprising:
   a control device for generating a trigger signal;
   a circuit that is responsive to the signal strength indicator signal from the tester circuit and extracts an AC component from the signal strength indicator signal to generate a limited signal strength indicator signal;
   a digital rising edge delay circuit, said rising edge delay circuit providing a high output signal after the rising edge of the trigger signal is detected;
   a digital falling edge delay circuit, said falling edge delay circuit providing a high output signal after the falling edge of the trigger signal is detected;
   a first latch circuit responsive to the trigger signal and the output signal from the rising edge delay circuit;
   a second latch circuit responsive to the limited signal strength indicator signal and the output signal from the rising edge delay circuit; and
   a third latch circuit responsive to the limited signal strength indicator signal and the output signal from the falling edge delay circuit, wherein the combined outputs of the first, second and third latch circuits gives an indication of the alignment of the tunable circuit.

14. The tester circuit according to claim 13 further comprising an AND logic gate and an exclusive OR logic gate, said AND logic gate being responsive to an output signal from the first latch circuit and an output signal from the second latch circuit, said AND logic gate providing a high output signal if the trigger signal is in-phase with the signal strength indicator signal, said exclusive OR gate being responsive to an output signal from the second latch circuit and an output signal from the third latch circuit, said exclusive OR gate providing a high output signal if the AC component is present on the limited signal strength indicator signal.

15. A method of aligning and tuning a receiver front end of a radio receiver, said method comprising the steps of:
   generating a tuning voltage;
   generating a tuning voltage antenna number;
   combining the tuning voltage antenna number with the tuning voltage to modulate the tuning voltage with the tuning voltage antenna number;
   applying the modulated tuning voltage to a tunable circuit in the receiver front end to modulate a tuned center frequency of the tunable circuit;
   monitoring a signal strength indicator signal as the modulated tuning voltage modulates the tunable circuit, said signal strength indicator signal being an indicator of the strength of a signal applied to the receiver front end after the signal has passed through the front end, wherein the step of monitoring the signal strength indicator signal includes generating a square wave trigger signal, comparing the square wave trigger signal to the signal strength indicator signal and determining whether an AC signal is superimposed on the signal strength indicator signal; and
   determining whether the tunable circuit is aligned to a desirable alignment point based on changes to the signal strength indicator signal, said step of determining whether the tunable circuit is aligned includes determining that the tunable circuit is aligned to the desirable alignment point if no AC signal is superimposed on the signal strength indicator signal and the trigger signal is out-of-phase with the signal strength indicator signal and determining that the tunable circuit is misaligned to a high side of a bandwidth curve of the tunable circuit if the trigger signal is out-of-phase with the signal strength indicator signal and an AC signal is superimposed on the signal strength indicator signal.

16. The method according to claim 15 wherein the step of combining the tuning voltage antenna number with the tuning voltage includes applying the tuning voltage to a multiplying digital-to-analog converter as an analog signal and applying the tuning voltage antenna number to the multiplying digital-to-analog converter as a digital signal.

17. The method according to claim 15 wherein the step of monitoring the signal strength indicator signal includes comparing a current signal strength indicator signal after the tuning voltage has been modulated by a first tuning voltage antenna number to a subsequent signal strength indicator signal after the tuning voltage has been modulated by a second tuning voltage antenna number.

18. A method of aligning and tuning a receiver front end of a radio receiver using a tester circuit that is a separate unit from the radio receiver and is electrically connected to the radio receiver during the aligning and tuning process, said method comprising the steps of:
   generating a tuning voltage;
   generating a tuning voltage antenna number;
   combining the tuning voltage antenna number with the tuning voltage to modulate the tuning voltage with the tuning voltage antenna number;
   changing the tuning voltage antenna number in order to vary the modulation of the tuning voltage;
   applying the modulated tuning voltage to a tunable circuit in the receiver front end to modulate a tuned center frequency of the tunable circuit;
   providing a signal strength indicator signal as the modulated tuning voltage modulates the tunable circuit, said signal strength indicator signal being an indicator of the strength of a signal applied to the receiver front end after the signal has passed through the front end;

providing the tester circuit as a separate unit from the radio receiver and electrically connecting the tester circuit to the radio receiver, said tester circuit receiving the signal strength indicator signal from the radio receiver;

generating a trigger signal in the tester circuit that is synchronous with the changes to the tuning voltage antenna number and in sequence with the modulation of the tuning voltage; and using digital logic circuitry in the tester circuit to determine whether the tunable circuit is aligned to a desirable alignment point based on changes to the signal strength indicator signal caused by the variations of the modulation of the tuning voltage, said digital logic circuitry determining whether the tunable circuit is aligned by comparing the trigger signal to the signal strength indicator signal, said digital logic circuitry determining whether the tunable circuit is aligned by determining whether an AC signal is superimposed on the signal strength indicator signal and then determining that the tunable circuit is misaligned to a high side of the bandwidth curve of the tunable circuit if the trigger signal is out-of-phase with the signal strength indicator signal and an AC signal is superimposed on the signal strength indicator signal.

\* \* \* \* \*